United States Patent
Su

(10) Patent No.: US 7,926,984 B2
(45) Date of Patent: Apr. 19, 2011

(54) LIGHT SOURCE HAVING LED AND FRAME STRUCTURE

(75) Inventor: Wen-Lung Su, Puli Township, Nantou County (TW)

(73) Assignee: Lextar Electronics Corp., Hsinchu (TW)

( * ) Notice: Subject to any disclaimer, the term of this patent is extended or adjusted under 35 U.S.C. 154(b) by 191 days.

(21) Appl. No.: 11/601,745

(22) Filed: Nov. 20, 2006

(65) Prior Publication Data

US 2008/0080194 A1   Apr. 3, 2008

(30) Foreign Application Priority Data

Jul. 21, 2006 (TW) .............................. 95212891 U

(51) Int. Cl.
  *F21V 7/10* (2006.01)
(52) U.S. Cl. ................ 362/329; 362/311.02; 362/362; 362/310; 313/512; 257/98
(58) Field of Classification Search .............. 362/84, 362/231, 249, 362, 800, 249.02, 612, 555, 362/545, 241, 243–248, 310, 311.02, 329; 257/99, 81, 98, E33.066, 100, 82; 313/512, 313/498; 438/26, 51, 55
  See application file for complete search history.

(56) References Cited

U.S. PATENT DOCUMENTS

| | | | | |
|---|---|---|---|---|
| 3,914,786 A | * | 10/1975 | Grossi | 257/98 |
| 6,858,880 B2 | * | 2/2005 | Horiuchi et al. | 257/100 |
| 6,876,149 B2 | * | 4/2005 | Miyashita | 313/512 |
| 7,193,365 B2 | * | 3/2007 | Ishizaka | 313/512 |
| 2003/0094622 A1 | * | 5/2003 | Horiuchi et al. | 257/100 |
| 2004/0046242 A1 | * | 3/2004 | Asakawa | 257/678 |
| 2004/0070338 A1 | * | 4/2004 | Noguchi et al. | 313/512 |
| 2004/0211970 A1 | * | 10/2004 | Hayashimoto et al. | 257/98 |
| 2005/0012108 A1 | * | 1/2005 | Lin et al. | 257/99 |
| 2006/0193121 A1 | * | 8/2006 | Kamoshita | 362/84 |
| 2006/0226435 A1 | * | 10/2006 | Mok et al. | 257/98 |
| 2006/0284207 A1 | * | 12/2006 | Park et al. | 257/99 |
| 2007/0029564 A1 | * | 2/2007 | Han et al. | 257/98 |

FOREIGN PATENT DOCUMENTS

JP    2005039104 A  *  2/2005

OTHER PUBLICATIONS

English Abstract of Japanese Publication JP 2005039104 A.*

* cited by examiner

*Primary Examiner* — Ismael Negron
(74) *Attorney, Agent, or Firm* — Rosenberg, Klein & Lee

(57) ABSTRACT

A frame structure includes a first metallic frame, a second metallic frame, and a plastic housing. The first metallic frame has extension portions extending outwardly, and the first metallic frame is separately positioned from the second metallic frame. The first metallic frame and the second metallic frame respectively have different electrical polarities. The plastic housing is connected with the first metallic frame and the second metallic frame, and the plastic housing and the two extension portions form a receiving space so the two extension portions are positioned at two ends of the plastic housing. The plastic housing receives the LED die and a packaging layer. The extension portions expose out of the plastic housing or are nestled within the plastic housing.

21 Claims, 6 Drawing Sheets

LIGHT SOURCE HAVING LED AND FRAME STRUCTURE

BACKGROUND OF THE INVENTION

1. Field of the Invention

The present invention relates to a frame structure for supporting a light emitting diode, and in particular to a frame structure for supporting a surface mount device (SMD) light emitting diode used as a side light source.

2. Description of Related Art

Light emitting diode (LED) is a semiconductor device that emits light when electrically biased in the forward direction. When voltage is applied to the semiconductor device such as gallium phosphide (GaP) or gallium arsenide (GaAs), charge-carriers (electrons and electron holes) flow into the junction from electrodes because of voltage. When electrons meet electron holes, the semiconductor device releases energy in the form of a photon unlike incandescent and discharging light sources. Because the LED is an electroluminescent device, life expectancy of the LED is up to 100,000 hours. Besides, the LED is compact, energy-saving, fit to mass production and clean so the LED is widely used, such as traffic lights and signals, backlight for electronic appliance, car's break light and lighting apparatus etc.

Referring to FIGS. 1 and 2, they show a frame structure for a surface mount device (SMD) LED used as a side light source. The frame structure is used to support a LED die so that a LED structure is formed and used as side-type backlight module for cellular phones or personal digital assistants (PDAs). The frame structure includes a plastic housing 10*a* and two metallic support frames 20*a* with different electrical polarities. The plastic housing 10*a* includes a receiving space 11*a*, and the two metallic support frames 20*a* are positioned within the plastic housing 10*a*. A LED die 30*a* is positioned at one of the two metallic support frames 20*a*, and the LED die 30*a* and the two metallic support frames 20*a* are electrically connected by conductive wires (not shown). The LED die 30*a* is packaged by an epoxy layer or a silicon layer and a packaging layer 40*a*, and the packaging layer 40*a* includes a variety of fluorescent powder. Besides, positive and negative polarities of electrical current are respectively applied to the two metallic support frames 20*a* so that the LED die 30*a* emits light.

However, electronic appliances need to be slim, compact and light-weighted to meet users' requirement. Thus, the frame structure for a surface mount device (SNM) LED should be smaller and thinner. If the plastic housing 10*a* is too smaller, then thickness d is thin so that the LED die 30*a* emits light through the plastic housing 10*a*. That is what is so called "light leakage". Besides, the two metallic support frames 20*a* are mostly enclosed by the plastic housing 10*a* so it is not easy for the LED die 30*a* to dissipate heat. Life expectancy of the LED die 30*a* is significantly shortened because of high temperature.

Thus, there is a need for a frame structure for supporting a light emitting diode used as a side light source.

SUMMARY OF THE INVENTION

It is an object of the present invention to provide a frame structure for supporting a surface mount device (SMD) light emitting diode used as a side light source. The frame structure has metallic frame including extension portions which are positioned besides the plastic housing. Because the metal is not transparent and its efficiency of heat dissipation is high, the frame structure has a good efficiency of heat dissipation without light leakage.

To achieve the object of the frame structure for supporting a surface mount device (SMD) light emitting diode used as a side light source, it includes at least one first metallic frame, at least one second metallic frame, and a plastic housing. The first metallic frame has two extension portions extending outwardly from its two ends, and the first metallic frame is in vicinity of and separated from the second metallic frame. The first metallic frame and the second metallic frame respectively have different electrical polarities. The plastic housing is connected with the first metallic frame and the second metallic frame, and the plastic housing and the two extension portions form a receiving space so that the two extension portions are positioned at two ends of the plastic housing.

BRIEF DESCRIPTION OF THE DRAWINGS

The present invention can be fully understood from the following detailed description and preferred embodiment with reference to the accompanying drawings, in which.

DETAILED DESCRIPTION OF THE PREFERRED EMBODIMENTS

The following detailed description is of the best presently contemplated modes of carrying out the invention. This description is not to be taken in a limiting sense, but is made merely for the purpose of illustrating general principles of embodiments of the invention. The scope of the invention is best defined by the appended claims.

Figure 1:
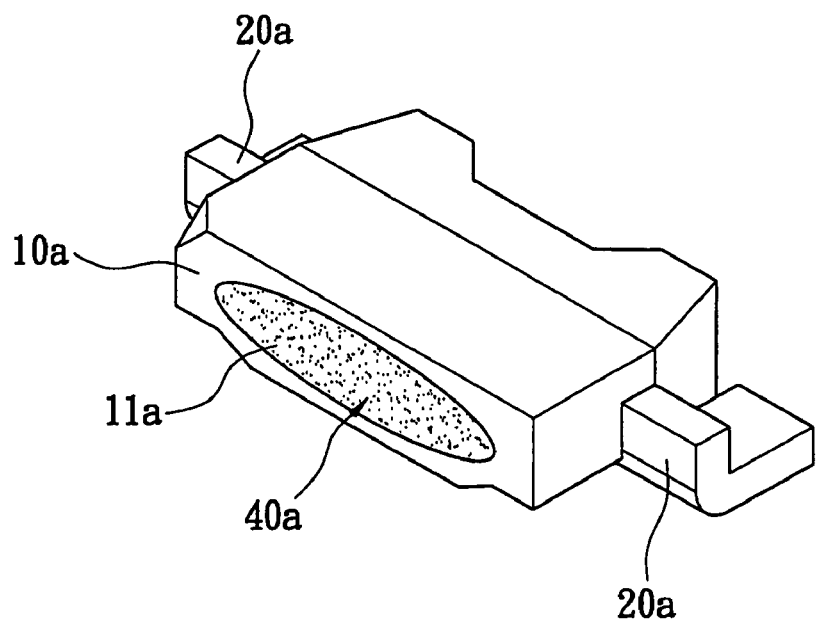
FIG. 1 is a perspective view of a frame structure for a surface mount device (SMD) LED used as a side light source in prior art.
Figure 2:
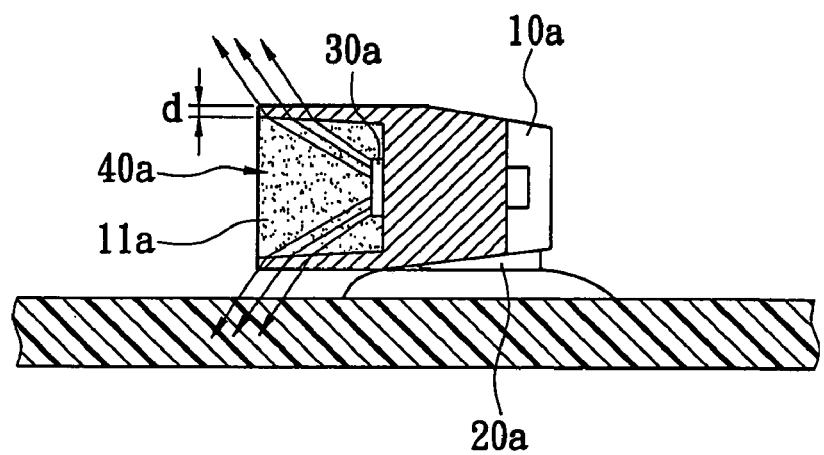
FIG. 2 is a cross-section of a frame structure for a surface mount device (SMD) LED used as a side light source in prior art.
Figure 3:
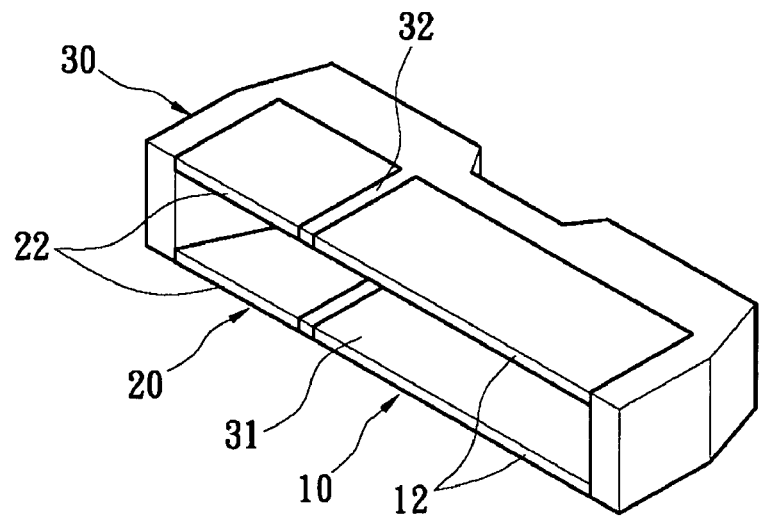
FIG. 3 is a perspective view of the first embodiment of the present invention.

Referring to FIG. 3, it illustrates a frame structure for supporting a surface mount device (SMD) light emitting diode used as a side light source including at least one first metallic frame 10, at least one second metallic frame 20 and a plastic housing 30.

FIGS. 3-6 illustrate the first embodiment of the present invention. For simplicity, there is one first metallic frame 10 and one second metallic frame 20 shown in FIGS. 3-6. Number of the first metallic frame 10 and one second metallic frame 20 is not limited to one. The first metallic frame 10 and the second metallic frame 20 are U-shaped and made of metallic material with good conductivity. Besides, the first metallic frame 10 and the second metallic frame 20 have different electrical polarities (positive polarity and negative polarity). The first metallic frame 10 and the second metallic frame 20 have base portions 11 and 21 respectively. Two extension portions 12 horizontally extend from two ends of the base portion 11 of the first metallic frame 10, and two extension portions 22 horizontally extend from two ends of the base portion 21 of the second metallic frame 20.

However, number of the first metallic frame 10 and the second metallic frame 20 may be 2 (not shown in the figure). That is, there are two sets of the base portion 11 and 21, and the extension portions 12 and 22 horizontally extend from each of two sets of the base portion 11 and 21.

The plastic housing 30 is manufactured by injection molding process to connect the first metallic frame 10 and the second metallic frame 20 so that the first metallic frame 10 and the second metallic frame 20 are separately positioned. Besides, the plastic housing 30 and the extension portions 12 and 22 form a receiving space 31 so that the extension portions 12 and 22 are respectively positioned at the top surface and bottom surface near the sides of the plastic housing 30. The base portions 11 and 21 are connected with the plastic housing 30 so outer surface of the base portions 11 and 21 expose out of the plastic housing 30, and the base portions 11 and 21 and the plastic housing 30 are in the same plane. Besides, the plastic housing 30 encloses the extension portions 12 and 22; that is, the extension portions 12 and 22 are positioned within the plastic housing 30 (not shown). Alternately, one of the extension portions 12 and 22 exposes out of the outer surface of the plastic housing 30, and the other one of the extension portions 12 and 22 is positioned within the plastic housing 30. Meanwhile, the plastic housing 30 fills a gap between the first metallic frame 10 and the second metallic frame 20 so that a separation strip 32 is formed to separate electrical polarities of the first metallic frame 10 and the second metallic frame 20.

According to the present invention, the plastic housing is made of non-conductive polymer material such as Polyphthalamide (PPA), Polybutylene Terephthalte (PBT), Polycarbonate (PC), Polymethyl Methacrylate (PMMA) or other thermo-plastic resin etc.

Figure 4:
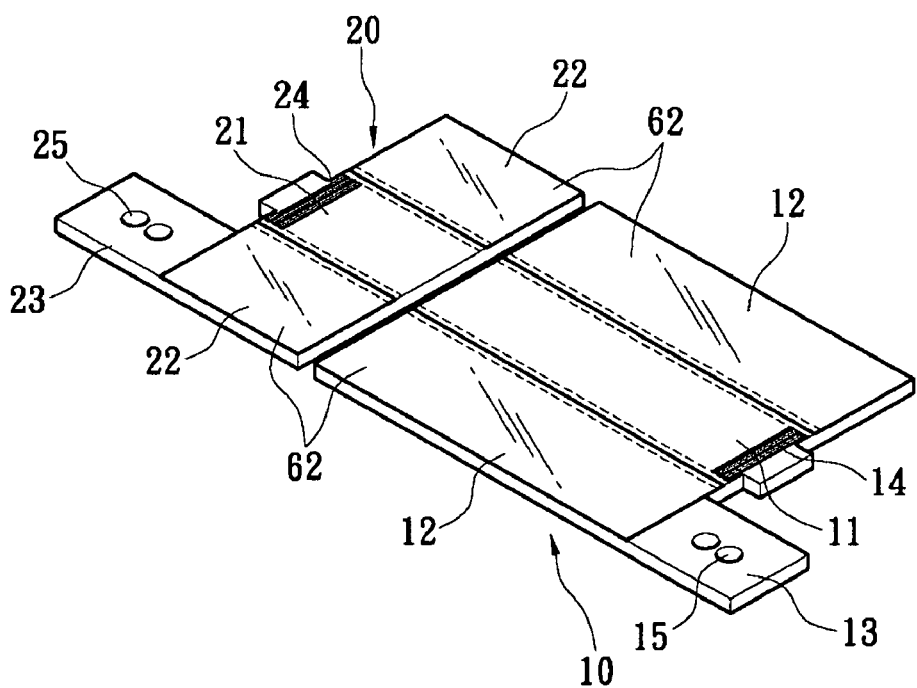
FIG. 4 is an exploded view of a first metallic frame and a second metallic frame according to the first embodiment of the present invention.
Figure 5:
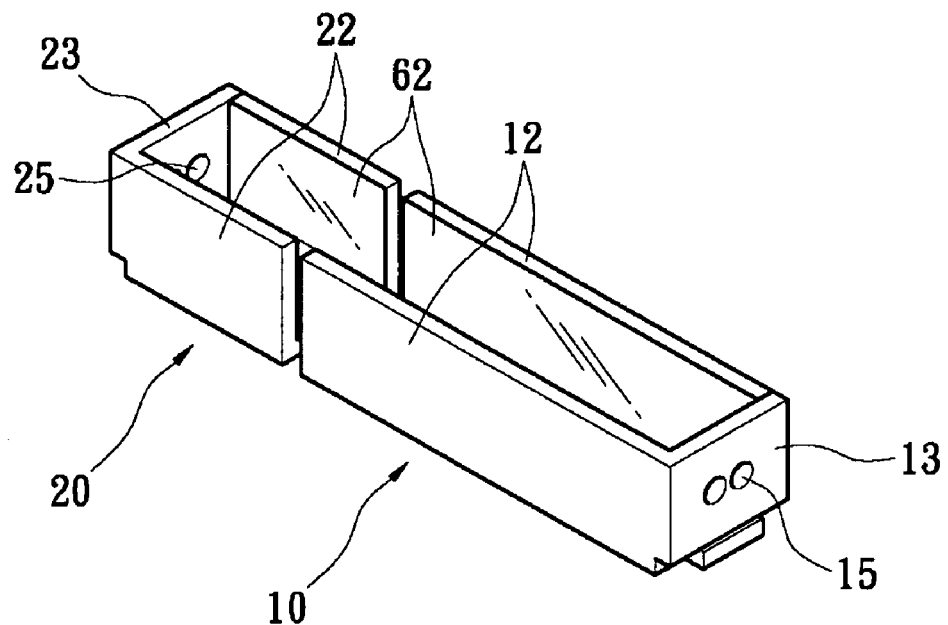
FIG. 5 is a perspective view of a first metallic frame and a second metallic frame according to the first embodiment of the present invention.
Figure 6:
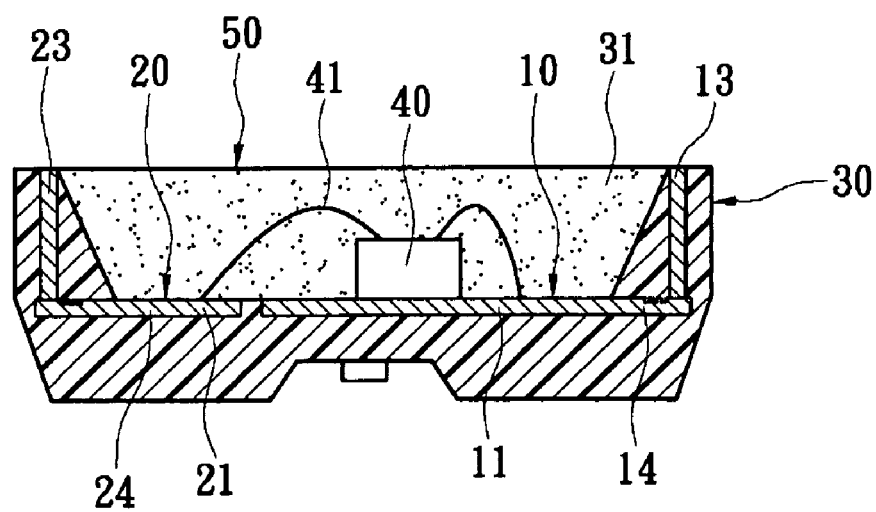
FIG. 6 is a cross-section of a first embodiment of the present invention.

Referring to FIG. 5, the extension portions 12 and 22 of one of the first metallic frame 10 and the second metallic frame 20 further extend inwardly so protrusions 13 and 23 are formed and positioned within the plastic housing 30 or positioned at two sidewalls of the receiving space 31. As shown in FIGS. 4-6, rough surface portions 14 and 24 or holes 15 and 25 are formed at the base portions 11 and 21 of the first metallic frame 10 and the second metallic frame 20 so as to secure the plastic housing 30. Besides, the protrusions 13 and 23 further include the holes 15 and 25 to secure the plastic housing 30. Alternately, the rough surface portions 14 and 24 may be in form of grooves or equivalents. The first metallic frame 10 and the second metallic frame 20 further include metallic reflective layers 62 respectively, and the metallic reflective layers are made of metal with high reflectivity such as silver by electroplating to improve reflectivity of light.

Figure 7:
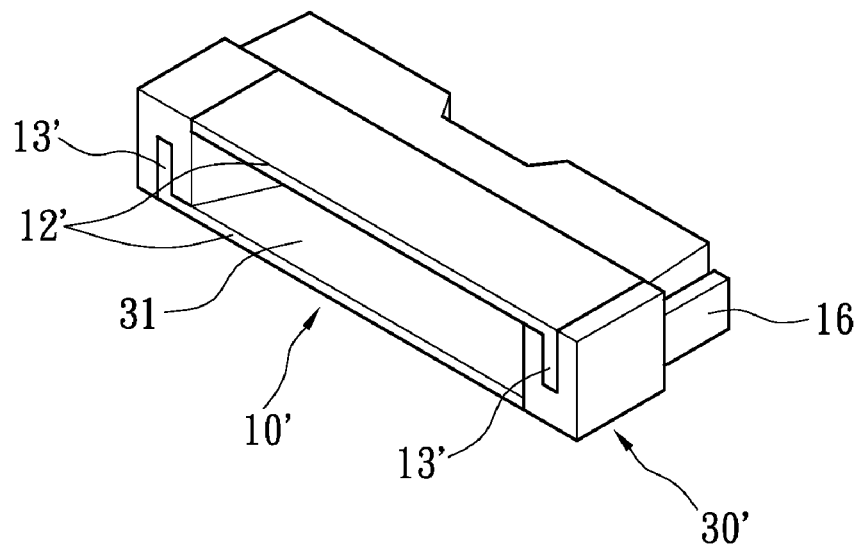
FIG. 7 is a perspective view of the second embodiment of the present invention.
Figure 8:
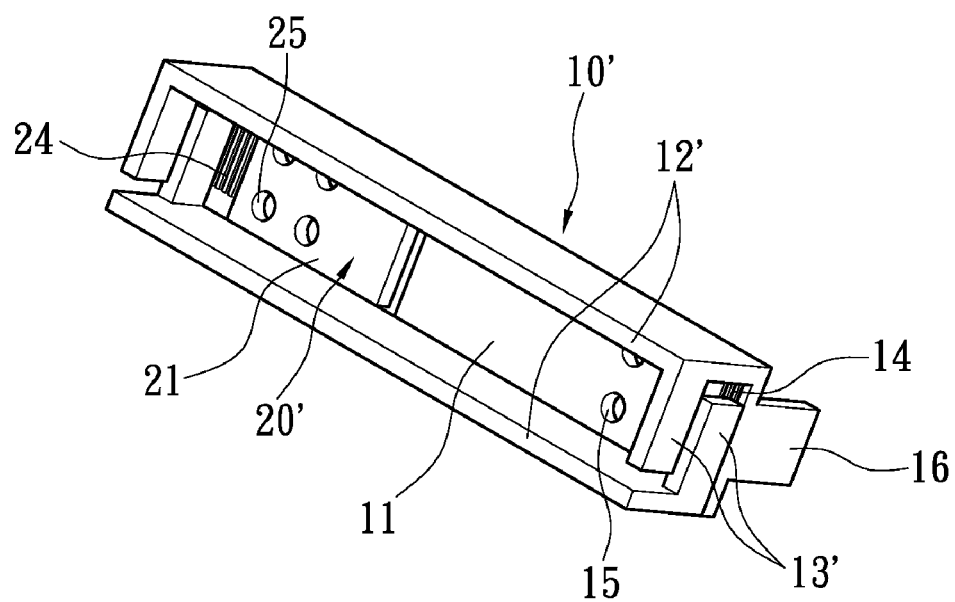
FIG. 8 is a perspective view of a first metallic frame and a second metallic frame according to the second embodiment of the present invention.
Figure 9:
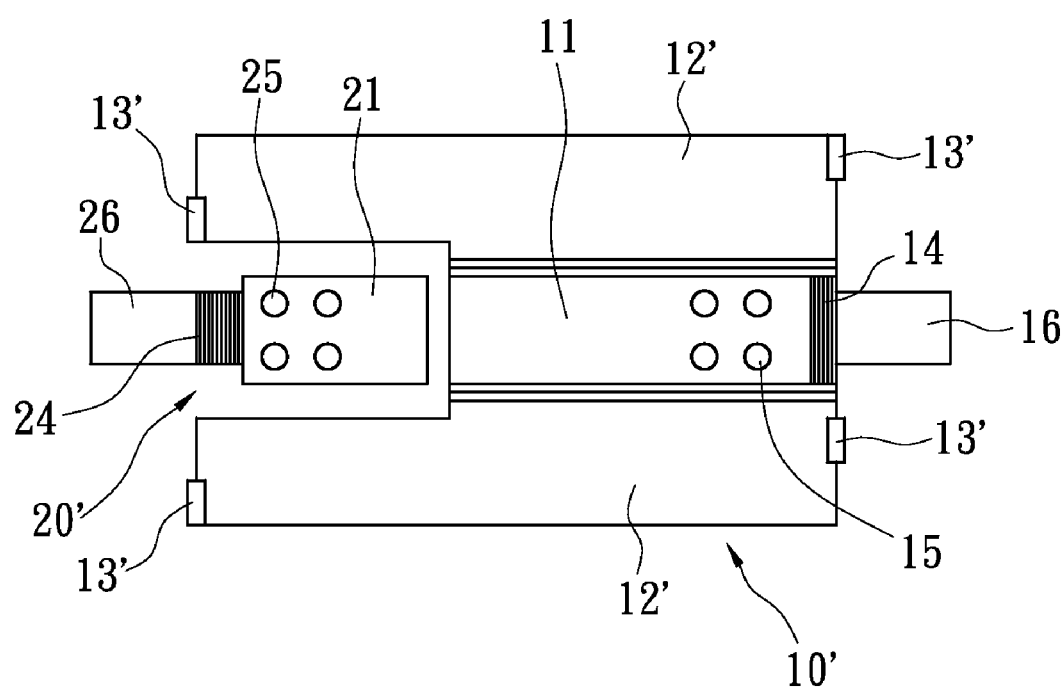
FIG. 9 is an exploded view of a first metallic frame and a second metallic frame according to the second embodiment of the present invention.

Referring to FIGS. 7-9, the second embodiment of the present invention is unlike the first embodiment. The extension portions 12' of the first metallic frame 10' further extend toward the base portion 21 of the second metallic frame 20' for a certain length so that the extension portion 12' is positioned out of the second metallic frame 20'. Besides, the extension portions 12' expose out of the surface of the plastic housing 30', and the extension portions 12' are in same plane with the plastic housing 30'. That is, the second metallic frame 20' just has the base portion 21. Bended portions 16 and 26 respectively extend away from the ends of the base portions 11 and 21 of the first metallic frame 10' and the second metallic frame 20', and the bended portions 16 and 26 expose out of and are in contact with the plastic housing 30'. The rough surface portions 14 and 24 are formed at the base portions 11 of the first metallic frame 10', and the bended portion 26 of the second metallic frame 20' is positioned within the plastic housing 30'. The base portions 11 and 21 of the first metallic frame 10' and the second metallic frame 20' have the holes 15 and 25 to improve rigidity of the plastic housing 30'.

Two protrusions 13' extend inwardly and are bended from the sides of the extension portion 12' respectively, and the two protrusions 13' are interleaved and positioned within the two sides of the plastic housing 30' to improve rigidity of the first metallic frame 10' and the plastic housing 30'.

Figure 10:
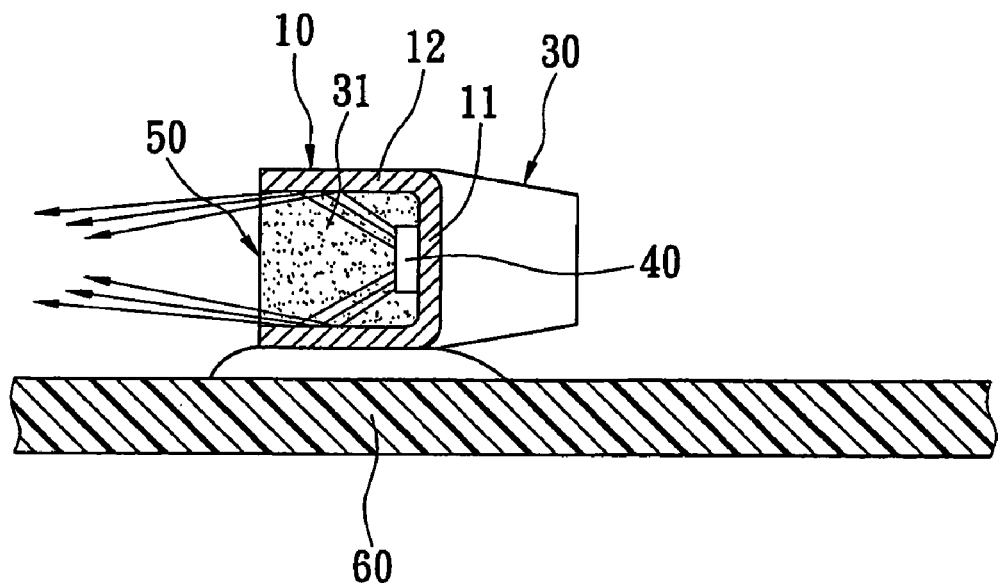
FIG. 10 is a view illustrating how the present invention is implemented.

Referring to FIGS. 6 and 10, a LED die (or LED chip) 40 are positioned at the base portion 11 of the first metallic frame 10' or positioned at the base portion 21 of the second metallic frame 20'. Then, the LED die 40 is electrically connected with the base portions 11 and 21 of the first metallic frame 10' and the second metallic frame 20' respectively by two conductive wires 41. A transparent packaging layer 50 is attached to the inner surface of the receiving space 31 so as to enclose the LED die 40. The transparent packaging layer 50 may be made of but not limited to epoxy resin, silicone or other thermoplastic resin etc. Besides, the epoxy resin, silicone or other thermoplastic resin may be mixed with florescent powders (such as yellow phosphor) so as to improve luminance of the LED die 40. When the first metallic frame 10' and the second metallic frame 20' are electrically connected with a printed circuit board 60 by the extension portions 12' and 22 or the bended portions 16 and 26, current flows through the first metallic frame 10' and the second metallic frame 20' by two conductive wires 41 so that the LED die 40 emits light beams.

Figure 11:
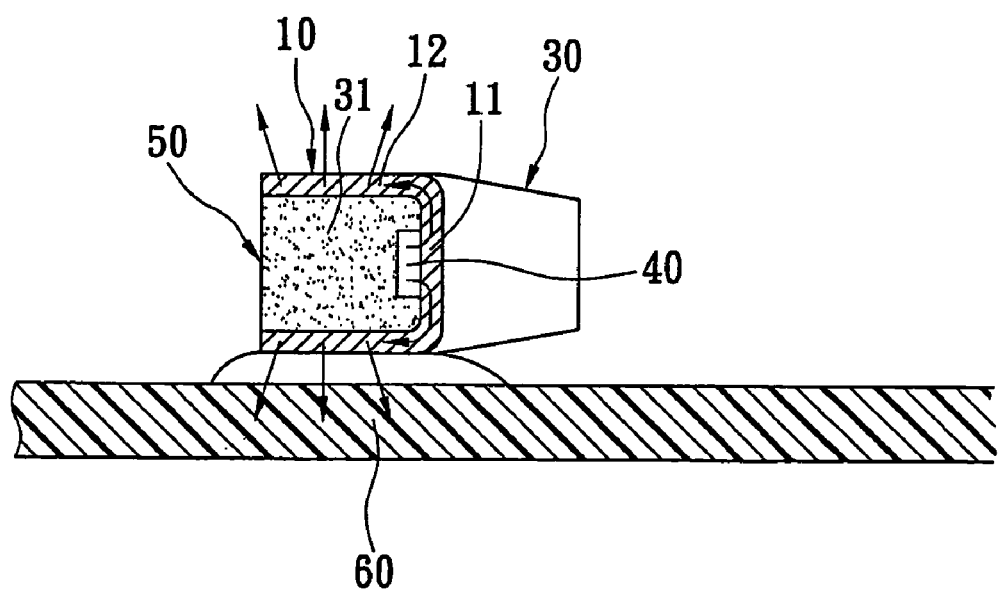
FIG. 11 is another view illustrating how the present invention is implemented.

Referring to FIGS. 10 and 11, the frame structure for surface mount device (SMD) LED of the present invention is used to prevent the light beams from penetrating through the plastic housing 30 and has a high efficiency of heat dissipation. The extension portions 12 and 22 of the first metallic frame 10 and the second metallic frame 20 expose out of the plastic housing 30, and the LED die 40 emits light beams toward the same direction and intensity of light beams is improved because metal is not transparent. The light beams will not penetrate through the plastic housing 30 and "light leakage" will not occur when the LED die 40 is thin and compact. Besides, when the LED die 40 is powered on, heat is generated and efficiently dissipated through the first metallic frame 10 or the second metallic frame 20 because of high efficiency of metal's heat dissipation. It prevents the LED die 40 from failure or life expectancy is shortened because of worse heat dissipation or high temperature of the plastic housing 30.

Advantages of the present invention can be summarized as in the following:

1. According to the first embodiment and the second embodiment of the present invention, the extension portions 12, 12' and 22 of the first metallic frame 10, 10' or the second metallic frame 20, 20' expose out of the plastic housing 30, 30' or are positioned within the plastic housing 30, 30', and the first metallic frame 10, 10' of the second embodiment further extends toward the second metallic frame 20, 20' so that the first metallic frame 10, 10' exposes out of or is positioned within the plastic housing 30, 30'. Furthermore, by utilizing metal is not transparent and has high heat conductivity, "light leakage" will not occur and heat can be efficiently dissipated.

2. The rough surface portions 14 and 24 or holes 15 and 25 are formed at the first metallic frame 10, 10' and the second metallic frame 20, 20' to improve the rigidity of the plastic housing 30, 30', the first metallic frame 10, 10' and the second metallic frame 20, 20'.

3. The protrusions 13, 13' and 23 of the present invention are positioned within the plastic housing 30, 30' to improve adhesion of the plastic housing 30, 30' to the first metallic frame 10, 10' and the second metallic frame 20, 20'.

4. A metallic conductive layer is attached to inner surfaces of the first metallic frame and the second metallic frame of the present invention to improve reflectivity of the LED die 40.

While the invention has been described with reference to the preferred embodiments, the description is not intended to be construed in a limiting sense. It is therefore contemplated that the appended claims will cover any such modifications or embodiments as may fall within the scope of the invention defined by the following claims and their equivalents.

What is claimed is:

1. A light source having LED and frame structure, comprising:
   at least one single sheet of a first metallic frame defining a first electrode, the first electrode having a base portion, and two longitudinally foldable extension portions extending outwardly from the base portion, wherein the two extension portions are each plate-shaped and longitudinally folded about the base portion at a malleable joint to form a pair of light reflectors panel members extending therefrom;
   at least one single sheet of a second metallic frame defining a second electrode, the second electrode being disposed in proximity to the first electrode and being separated therefrom by a gap, and the first electrode and the second electrode respectively being coupled to different electrical polarities;
   a plastic housing connected with the first metallic frame and the second metallic frame, the plastic housing engaging the extension portions at peripheral edges thereof, the light reflector panels defined by the extension members being thereby suspended from the plastic housing, the plastic housing and the two extension portions forming a receiving space; and
   a light emitting diode disposed in the receiving space and mounted to the base portion of one of the first electrode and the second electrode, wherein the two extension portions extend in a direction of light emission from the light emitting diode and thereby reflect light emitted by the light emitting diode outwardly from the receiving space;
wherein the first metallic frame and the second metallic frame respectively have rough surface portions formed on the edges by a plurality of grooves so as to secure the plastic housing.

2. The light source having LED and frame structure as claimed in claim 1, wherein a metal reflective layer is applied to inner surfaces of the first electrode and the second electrode.

3. The light source having LED and frame structure as claimed in claim 1, wherein the first electrode and the second electrode respectively have through holes formed therein for securing the plastic housing thereto.

4. The light source having LED and frame structure as claimed in claim 1, wherein a protrusion extends inwardly from one end of one of the extension portions and are positioned within the plastic housing or the receiving space.

5. The light source having LED and frame structure as claimed in claim 1, wherein the extension portions further extend toward the second electrode so that the extension portions are positioned outside of and spaced from the second electrode.

6. The light source having LED and frame structure as claimed in claim 1, wherein the plastic housing is made of non-conductive polymer material.

7. The light source having LED and frame structure as claimed in claim 1, wherein the plastic housing fills the gap between the first electrode and the second electrode so that an insulative separation strip is formed to separate electrical polarities of the first electrode and the second electrode.

8. The light source having LED and frame structure as claimed in claim 1, wherein said extensions and base portions of the first metallic frame define a substantially U-shaped sectional contour.

9. The light source having LED and frame structure as claimed in claim 1, wherein bended portions extend away from one end of the first metallic frame and the second metallic frame, and the bended portions are exposed external to two sides of the plastic housing.

10. The light source having LED and frame structure as claimed in claim 9, wherein the rough surface portions are positioned within the plastic housing and the bended portions are assembled.

11. The light source having LED and frame structure as claimed in claim 1, wherein the light emitting diode includes a light emitting diode die electrically connected with the first electrode and the second electrode respectively by two conductive wires, and a transparent packaging layer is attached to an inner surface of the receiving space and encloses the light emitting diode die.

12. The light source having LED and frame structure as claimed in claim 11, wherein the transparent packaging layer is made of epoxy resin or silicone, and the packaging layer includes a fluorescent paint to improve luminance.

13. The light source having LED and frame structure as claimed in claim 1, wherein a pair of second extension portions extend outwardly from the second electrode to form light reflectors and are positioned at two sides of the plastic housing so that the second electrode and the plastic housing form a portion of the receiving space.

14. The light source having LED and frame structure as claimed in claim 13, wherein the second extension portions of the second electrode are exposed external to the plastic housing or are nestled within the plastic housing.

15. The light source having LED and frame structure as claimed in claim 13, wherein a protrusion extends inwardly from one side of the second extension portion of the second electrode and is positioned within the plastic housing or within the receiving space.

16. A metallic frame of a light source having LED and frame structure, comprising:
   a base portion having a light emitting diode mounted thereon; and
   two longitudinally foldable extension portions extending from two ends of the base portion in a direction of light emission from the light emitting diode to form light reflectors, the two extension portions each being plate-shaped and longitudinally folded about the base portion at a malleable joint to form a pair of light reflector panel members extending therefrom, the extension portion and light reflector panels defining in deflectable manner a substantially U-shaped sectional contour about a receiving space, wherein the two extension portions are impinged by light emitted from the light emitting diode and reflect the light outwardly from the receiving space; wherein the base portion has rough surface portions formed on the edges by a plurality of grooves.

17. The metallic frame of a light source having LED and frame structure as claimed in claim 16, wherein the base portion has holes formed therethrough.

18. The metallic frame of a light source having LED and frame structure as claimed in claim 16, wherein a protrusion extends from one side of at least one of the extension portions.

19. The metallic frame of a light source having LED and frame structure as claimed in claim 16, wherein a bended portion extends away from one end of the base portion for coupling to a printed circuit board.

20. The metallic frame of a light source having LED and frame structure as claimed in claim 19, wherein the bended portion has a rough surface portion.

21. A light source having LED and frame structure, comprising:
at least one single sheet of a first metallic frame defining a first electrode, the first electrode having a base portion, and two longitudinally foldable extension portions extending outwardly from the base portion, wherein the two extension portions are each plate-shaped and longitudinally folded about the base portion at a malleable joint to form a pair of light reflectors panel members extending therefrom;
at least one single sheet of a second metallic frame defining a second electrode, the second electrode being disposed in proximity to the first electrode and being separated therefrom by a gap, and the first electrode and the second electrode respectively being coupled to different electrical polarities;
a plastic housing connected with the first metallic frame and the second metallic frame, the plastic housing engaging the extension portions at peripheral edges thereof, the light reflector panels defined by the extension members being thereby suspended from the plastic housing, the plastic housing and the two extension portions forming a receiving space; and
a light emitting diode disposed in the receiving space and mounted to the base portion of one of the first electrode and the second electrode, wherein the two extension portions extend in a direction of light emission from the light emitting diode and thereby reflect light emitted by the light emitting diode outwardly from the receiving space;
wherein the extension portions are exposed external to the plastic housing or are nestled within the plastic housing.

* * * * *